United States Patent [19]

Kaufman

[11] Patent Number: 5,357,958
[45] Date of Patent: Oct. 25, 1994

[54] INTERVENTIONAL MRI SYSTEM AND RF COILS THEREFORE

[75] Inventor: Leon Kaufman, San Francisco, Calif.

[73] Assignee: The Regents of the University of California, Oakland, Calif.

[21] Appl. No.: 33,551

[22] Filed: Mar. 18, 1993

[51] Int. Cl.⁵ .............................................. A61B 5/05
[52] U.S. Cl. .................. 128/653.2; 128/653.5; 324/318; 324/322; 600/13
[58] Field of Search ............... 324/318, 322, 309; 128/653.2, 653.5; 600/13-15

[56] References Cited

U.S. PATENT DOCUMENTS

| | | | |
|---|---|---|---|
| 4,411,270 | 10/1983 | Damadian | 128/653.2 |
| 4,617,516 | 10/1986 | Schenck | 324/309 |
| 4,728,896 | 3/1988 | Bendall et al. | 324/309 |
| 4,774,468 | 9/1988 | Bydder | 324/318 |
| 4,829,252 | 5/1989 | Kaufman . | |
| 4,897,604 | 1/1990 | Carlson et al. . | |
| 4,956,609 | 9/1990 | Miyajima | 324/318 |
| 5,023,554 | 6/1991 | Cho et al. | 324/309 |
| 5,107,216 | 4/1992 | Yabusaki et al. | 324/318 |
| 5,111,147 | 5/1992 | Aubert | 324/309 |
| 5,155,435 | 10/1992 | Kaufman et al. . | |
| 5,180,982 | 1/1993 | Zeiger | 324/318 |
| 5,184,074 | 2/1993 | Kaufman et al. . | |
| 5,184,076 | 2/1993 | Ehnholm | 324/318 |
| 5,218,964 | 6/1993 | Sepponen | 128/653.2 |
| 5,311,868 | 5/1994 | Carbini et al. | 128/653.5 |

*Primary Examiner*—Lee S. Cohen
*Assistant Examiner*—Brian L. Casler
*Attorney, Agent, or Firm*—Nixon & Vanderhye

[57] ABSTRACT

An MRI RF coil utilizes a helical conductor having a plurality of turns and a non-uniform pitch between turns along at least a portion of the axial length of the coil. The non-uniform pitch is disposed so as to accommodate interventional procedures and/or interventional apparatus (e.g., stereotaxic frames) when used on a human patient in conjunction with magnetic resonance imaging. The non-uniform pitch portion of the coil may comprise a simple gap, an opening formed by deformation or angular disposition of some or all of the coil turns and/or by utilizing fringe field effects of the coil to accomplish at least some of the magnetic resonance imaging procedure.

14 Claims, 3 Drawing Sheets

INTERVENTIONAL MRI SYSTEM AND RF COILS THEREFORE

BACKGROUND OF THE INVENTION

1. Field of the Invention

This invention relates generally to the field of magnetic resonance imaging (MRI) utilizing nuclear magnetic resonance (NMR) phenomena. The invention particularly relates to interventional MRI systems and to RF coils especially adapted for interventional procedures conducted during or in conjunction with MRI.

2. Description of the Prior Art

Commercial MRI systems of many different designs are now readily available on the market. Some of these designs use large solenoidal cryogenic superconducting magnets for generation of the static polarizing field $B_o$. Since the patient is totally enclosed within a long tunnel during MRI on such systems, it is difficult to contemplate significant interventional procedures to be conducted during or in conjunction with MRI. However, other commercially available MRI systems use transverse magnet structures in conjunction with permanent magnets, resistive or superconducting electromagnets for generating magnetic flux $B_o$ between opposing transverse magnet poles). With such transverse magnet MRI systems, open access to the imaging area has become a possibility. One such four-poster (for return flux yokes) transverse magnet structure is depicted in related commonly assigned U.S. Pat. No. 4,829,252-Kaufman (the entirety of which is hereby incorporated by reference). Such systems are commercially available, for example, under the trademark "ACCESS" from Toshiba. Here, improved access to the image volume is already provided by forming apertures in the large transmit RF coil formers otherwise encompassing the image volume (even though all four sides of the four-poster magnet structure are left open by the housing).

A later improvement provides flat pancake-like RF transmit coils so as to leave the image volume totally unobstructed (except for RF receive coils). These flat pancake-like RF transmit coils are described, for example, in co-pending commonly assigned U.S. patent application Ser. No. 08/025,418, filed Mar. 1, 1993, naming McCarten et al as inventors entitled "RF Coil Providing Reduced Obstruction Access to Image Volume in Transverse Magnet MRI System" (the entire content of which is hereby incorporated by reference). Unfortunately, MRI processes typically require higher Q, more closely coupled, RF coils for receiving relatively weak NMR RF signals.

Interventional apparatus and methods for use with transverse magnet MRI systems have already been described in various contexts. For example, see commonly assigned issued U.S. Pat. No. 5,155,435 to Kaufman et al entitled "Method and Apparatus for Performing Interventional Medical Procedures Using MRI Imaging of Interventional Device Superimposed with Ghost Patient Image" and commonly assigned U.S. Pat. No. 5,184,074, issued to Kaufman et al (allowed U.S. patent application Ser. No. 07/650,215, filed Feb. 4, 1991) entitled "Real Time MRI Imaging Inside Gantry Room."

As will be appreciated by those in the art, solenoidal RF coils have found considerable application in transverse magnet MRI systems. In significant part, this is because a transverse MRI apparatus provides the static polarizing field $B_o$ directly between two opposed magnet faces which are typically disposed horizontally and thus the polarizing field $B_o$ is disposed vertically therebetween. Accordingly, to obtain the necessary transverse RF magnetic field for effecting NMR phenomena, a solenoidal RF coil is perhaps a natural choice. At the same time, a solenoidal coil disposed around the image volume presents a substantial obstacle to many interventional procedures.

BRIEF SUMMARY OF THE INVENTION

This invention provides a family of RF coils for use in interventional MRI procedures. Although the RF coils of this invention are particularly suited for RF receive functions, they may also be used for RF transmit functions in certain situations. The RF coils in this invention find particularly favorable use with transverse "open" design magnets, real time fluoroscopy with "in the room" display and "ghost" MRI, although the invention is clearly not limited just to use in these contexts.

There are at least two general classes of interventional procedures that doctors may wish to perform during or in conjunction with MRI (e.g., so as to assist the interventional physician with more accurate and/or efficacious interventional results). First of all, during surgery, a needle may be inserted either to deliver therapeutic agents to a region of the body and/or to obtain a biopsy from that region. Such processes may also involve cuts in conjunction with or instead of needle placement. Secondly, during stereotaxy, an external physical device (e.g., a frame) is typically affixed to the patient anatomy such that external landmarks on the device are related to internal features of the body. Most typically, stereotaxic procedures are performed within the cranium with stereotaxic frames being literally screwed into the cranium so as to provide a stable and known frame of reference for use of various surgical instruments and procedures.

Such interventional procedures have common and specific needs. For example, both require a relatively unencumbered working field around an entrance point. In addition, stereotaxy often requires space all about the circumference of the relevant anatomy (typically the head) for attachment of this stereotaxic frame. Prior to this invention, such space requirements were typically accommodated by simply using a larger diameter RF coil. However, this leads to a consequent loss in signal-to-noise ratio and thus in quality of MRI that is available during interventional procedures. It also often leaves relatively cumbersome access for the interventional physician.

The RF coils of this invention provide substantially improved access to the imaged anatomy so as to better accommodate interventional procedures during and/or in conjunction with MRI. For example, a helical conductor having a plurality of turns may be provided with a non-uniform pitch between turns along at least a portion of the axial coil length. This non-uniform pitch portion may be disposed so as to accommodate interventional (e.g., stereotaxic) appliances therewithin.

The non-uniform pitch portion of the coil may be as simple as a bridged gap in an otherwise uniform helical coil. The bridge across such gap may be either at the same or extended radius depending upon the nature of the desired/needed access. Alternatively, the non-uniform pitch portion of the coil may be achieved by disposing a first group of turns at a positive angle with respect to perpendicular cross-section of the coil and a second group of turns at a negative angle with respect to the same perpendicular cross-section thereby providing an angular opening equal to the sum of such angles between these two groups of turns. Other deformations of a portion of the helical coils are also proposed to create an open access area along at least one side of the RF coil structure. A still further alternative is to use the fringe RF field of a specially dimensioned coil to achieve, at least in part, MRI in conjunction with interventional apparatus/procedures that are conducted entirely beyond the end boundary of the physical coil structure.

BRIEF DESCRIPTION OF THE DRAWINGS

These as well as other features and advantages of this invention will be more completely understood and appreciated by careful study of the following detailed description of presently preferred exemplary embodiments taken in conjunction with the accompanying drawings of which.

DETAILED DESCRIPTION OF EXEMPLARY EMBODIMENTS

Figure 1:
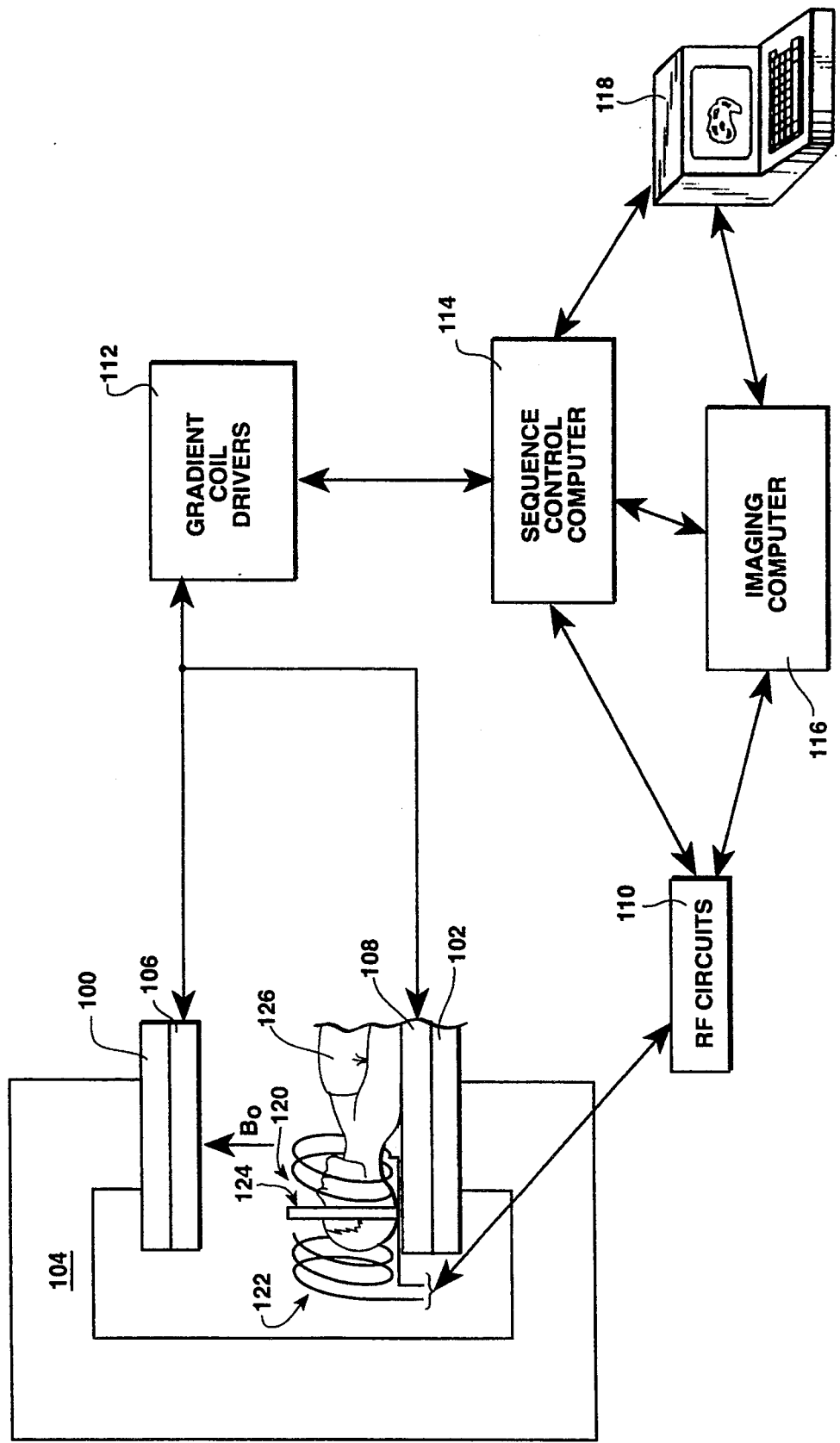
FIG. 1 is a schematic block diagram of an interventional MRI system employing a gapped solenoid RF coil of this invention.

FIG. 1 schematically depicts a transverse magnet: MRI system. The main polarizing field $B_o$ is created between horizontally disposed magnet poles 100, 102 with massive ferrous yoke structure 104 being provided for a return flux path. As those in the art will appreciate, permanent magnets may actually be located at the poles or elsewhere within the magnetic circuit 104 (as may resistive or superconducting electromagnets) so as to provide the necessary polarizing field $B_o$.

Flat pancake-like gradient coils 106, 108 are typically also utilized so as to provide gradients in the polarizing field $B_o$ along the usual orthogonal coordinates X,Y,Z. As noted above, newly developed flat pancake-like RF coils (for RF transmit functions) may also be located at the poles of the magnet in conjunction with the magnetic gradient coils 106, 108. A greatly simplified schematic showing of the remainder of the system is depicted by RF circuits 110, gradient coil drivers sequence control computer subsystem 114, imaging computer subsystem 116 and an operator console 118. As those in the art will appreciate, depending upon which MRI sequence has been selected by the operator via console 118, sequence control computer 114 will then effect a predetermined MRI data acquisition sequence by activating the RF circuits 110 and gradient coil drivers 112 to generate a suitable sequence of X,Y,Z magnetic gradient pulses and NMR RF nutation pulses so as to generate spatially encoded NMR RF signal responses. These NMR RF signal responses are then received via the RF circuits 110 and processed in imaging computer 116 so as to provide a visual image of the spatial distribution of NMR nuclei within the image volume 120 of the system.

As depicted in FIG. 1, the RF receive coil 122 is a gapped solenoid having helical turns interrupted by a bridged gap to accommodate a stereotaxy frame 124 affixed to the head of patient 126. As will be apparent in the context of the above referenced related co-pending applications and/or issued patents, there are various ways in which MRI can be advantageously utilized during or in conjunction with various interventional procedures.

Figure 7:
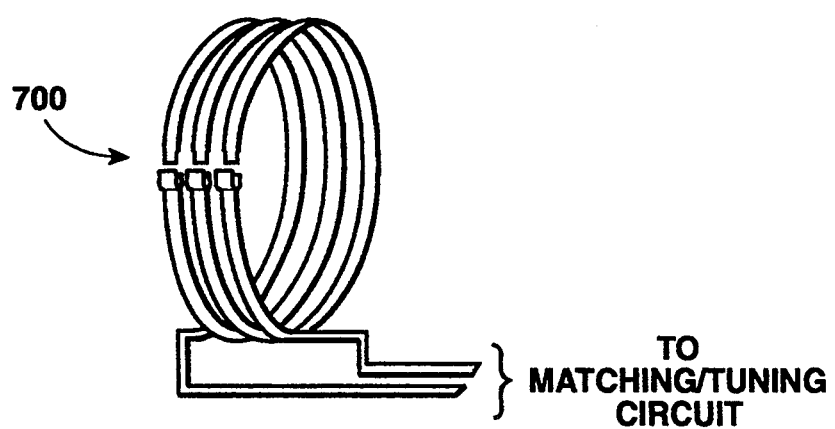
FIG. 7 is a schematic depiction of flexible belted helical coils having circumferential connectors (e.g., see U.S. Pat. No. 4,897,604—Carlson et al) which may be used in the embodiments of FIGS. 2-6 thereby facilitating installation of the coils into operative position after the stereotaxy device is already in place.

Preferably at least one side of the coil 122 is provided on a flexible substrate or former with connectors 700 aligned along an edge of the substrate (see FIG. 7). In this way, the coil conductors may be temporarily interrupted and flexed open to facilitate sideways insertion of patient anatomy located on the distal side of the stereotaxy frame 124 (e.g., the lower face and neck as shown in FIG. 1). That is, while the proximal half of the coil 122 might be installed axially over the relevant anatomy (e.g., the top of a head), it may be impossible to similarly install the distal half of the coil after the stereotaxy frame is in place. The use of a flexible coil former that can be disconnected for radial installation solves this problem. Of course, both halves of coil 122 can be formed in the same flexible manner if desired for maximum flexibility in use.

Figure 2:
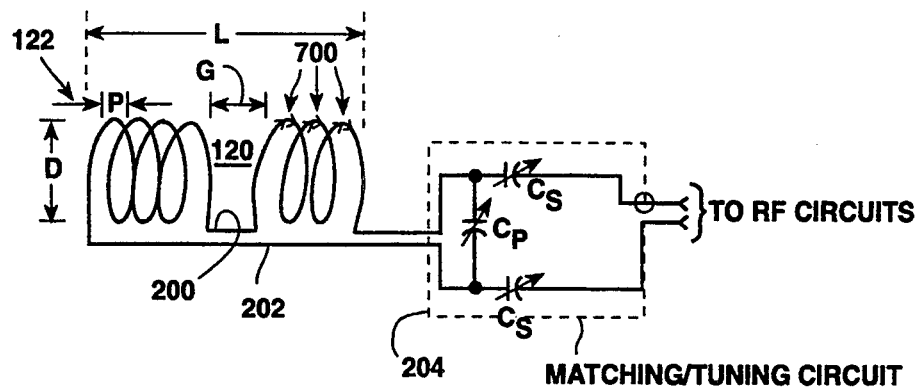
FIG. 2 is a more detailed schematic depiction of the gapped solenoid shown in FIG. 1.

The gapped solenoid 122 is shown in more detail at FIG. 2. As there shown, the entire RF coil has a length L and a diameter D. The coil turns are helical in this example with a nominal pitch P. However, along a central axial length of the coil, there is a gap G, thus making the pitch of the overall coil non-uniform along its length L.

In general, the gap G may quite conservatively be made equal to a radius (D/2) of the coil or less. With some accepted degradation, wider gaps may be employed. In this example, the coil diameter D may, for example, be approximately 12 inches while the nominal pitch P may be approximately 1.2 inches. The coil conductor itself may be formed from copper strap (e.g., of 0.010 to 0.020 inch thick by ¼ to ⅜ inch wide). The coil may typically include three to four turns on either side of the gap G.

As depicted in FIG. 2, the bridge conductor 200 across the gap G and the return conductor 202 pass to a matching/tuning circuit 204. Here the usual series capacitances $C_s$ and parallel capacitances $C_p$ are used to resonate the coil (e.g., at about 2.7 MHz in the Toshiba ACCESS system) while also matching the coil impedance to a desired transmission line impedance (e.g., 50 ohms). As depicted in FIG. 2, the tuned/matched RF connection is then connected to the RF circuits 110

(typically via a "ground breaker" to avoid spurious RF currents passing over the outside of coaxial cable transmission lines). The matching/tuning circuits 204 may also be remotely located. In this case, a "ground breaker" is advantageously employed close to the coil 122 so as to avoid spurious RF currents over the outer conductor of the interconnecting coaxial transmission line.

Figure 3:
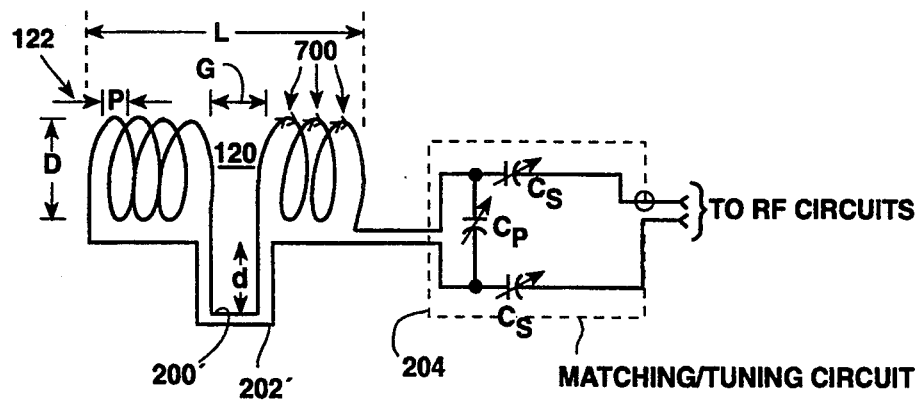
FIG. 3 is a schematic depiction of a modified gapped solenoid wherein the bridging conductors across the gap are disposed at an increased radius so as to provide 360° of, larger radius, circumferential access to the imaged volume.

The gapped solenoid structure shown in FIG. 3 is similar to that in FIG. 2 except that the bridge conductor 200' and the return conductor 202' are extended radially by the distance d thereby providing 360° access of increased radius to the image volume 120. This embodiment may be particularly attractive for accommodating a stereotaxic device. Since the gap G is typically not made wide enough to accommodate a human head therewithin transversely, the patient head (or other anatomy) will typically be inserted or removed along the longitudinal axis of the coil (for at least the proximal half of the coil).

Figure 4:
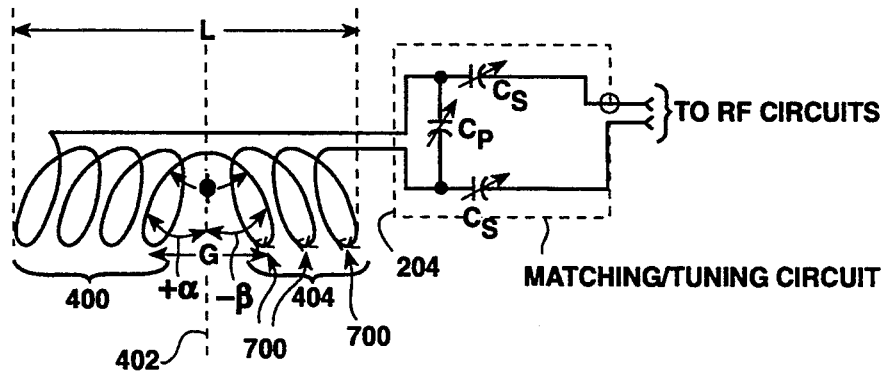
FIG. 4 is yet another embodiment of the gapped solenoid of this invention wherein the gap is formed by complimentary angular disposition of the coil turns so as to create a gap at one side thereof.

The embodiment shown in FIG. 4 includes a first group of turns 400 disposed at an angle $+\alpha$ with respect to a perpendicular cross-section 402 of the coil. A second group of turns 404 disposed at an angle $-\beta$ with respect to the perpendicular cross-section 402. This provides an angular opening of $\alpha+\beta$ (e.g., angle $\phi$ as shown in FIG. 4) between the two groups of turns 400, 404. Preferably, $\alpha$ and $\beta$ are approximately equal so as to provide a symmetrical structure. As will be appreciated from FIG. 4, the half angle of the opening may be on the order of 30° or more so as to provide a relatively wide gap area G on at least one side of the coil.

Figure 5:
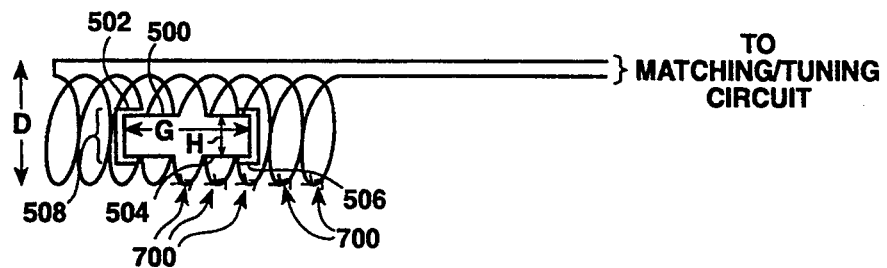
FIG. 5 is yet another embodiment of the gapped solenoid wherein a gap is created and one side of the solenoid by providing axially-extending offset deformations in the coil conductors along a circumferential portion of a subset of the turns.

FIG. 5 depicts yet another approach for achieving non-uniform pitch portion of the helical coil. Here, axially extending offset deformations 500, 502, 504 and 506 are made in the conductors along a circumferential portion 508 of a subset of the turns. In this way, a central opening of dimensions G wide and H high can be formed in one side of the coil.

Other techniques for providing a non-uniform pitch portion of a helical coil and thus providing access to the image volume should be apparent in view of the above examples.

Figure 6:
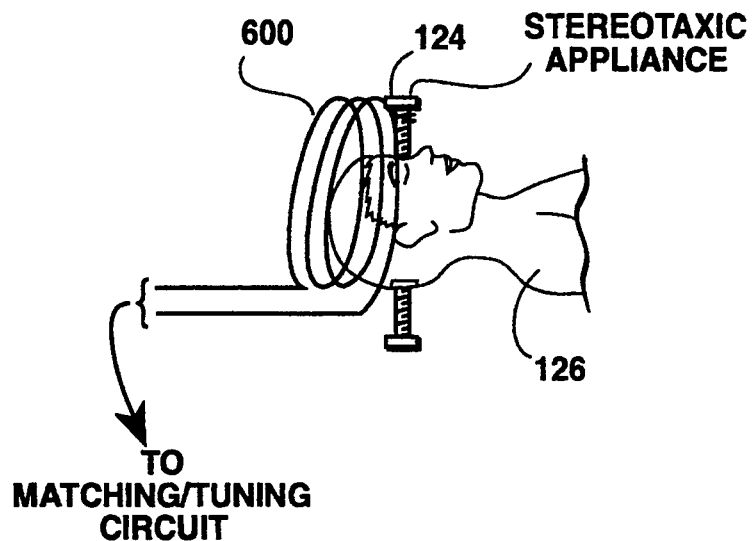
FIG. 6 is a schematic depiction of yet another embodiment of this invention utilizing the fringe field of the RF coil for achieving, at least in part, MRI in conjunction with interventional procedures.

FIG. 6 partially depicts a stereotaxic appliance 124 in place on the human head of patient 126. Now, however, only one, relatively thin (in the axial dimension), coil 600 is placed immediately adjacent the working area of interest. Accordingly, such a coil can be inserted entirely from the free side (e.g., from the top of the head in the case of the stereotaxic head frame) as depicted in FIG. 6. From the center of the coil 600, with respect to a radius distance R and an axial dimension Z, the magnitude of the RF field drops as the cube root of the quantity $(R^2+Z^2)$. Using this relation and assuming a 22 centimeter diameter coil, one may compare relative sensitivity with respect to the maximum sensitivity that will be achieved at the coil center.

For example, relative to the expected maximum signal sensitivity at the coil center, coil sensitivity to RF fields located 2 centimeters from the center will be 95%, at 5 centimeters 75% and at 7 centimeters only 60% of the maximum coil sensitivity. On the other hand, if one makes a larger coil (e.g., so as to conventionally accommodate stereotaxy devices and interventional procedures), the coil sensitivity is reduced drastically even at the center of the coil. For example, if the coil is made only four centimeters larger in diameter (e.g., 26 centimeter diameter coil) so as to accommodate stereotaxic devices, one is left with only 40% of the sensitivity expected for the smaller (e.g., 22 centimeter diameter coil)-even at the center location (e.g., within the center of the image volume). The further reductions when one is displaced from the center are similarly drastically affected).

Furthermore, even though a 4 centimeter larger diameter coil might make it possible to perform some interventional procedures, an uninterrupted uniform pitch helical coil structure necessarily typically will provide substantial interference with manipulation of the stereotaxic device or other interventional procedures that might be desired. Accordingly, the use of fringe fields as shown in FIG. 6 not only provides at least as much if not more RF receive coil sensitivity as the conventional larger diameter coil (and thus provides comparatively enhanced MRI), it also provides substantially unimpeded access for interventional procedures as depicted in FIG. 6. Accordingly, this is considered to be a substantial improvement.

As mentioned earlier, for at least half of the coil, it may be desirable to use flexible, belted solenoids that can be "opened" to facilitate initial coil placement as depicted in FIG. 7. Here, greater physical flexibility is provided because this portion of the coil may be broken apart at a connector 700 and flexed so as to accommodate patient insertion, set up procedures, etc. One such belted coil might be disposed and interconnected with fringe field effects as in FIG. 6. One or two such coils may be utilized in the configuration of FIGS. 2-5 where one or each half of the coil is flexible and broken by a connector 700. Extra bridging coil sections may also be connected in the connector 700 to provide different coil diameters as required. For more details on creating variably sized, belted, solenoids per se, (e.g., flexible helical conductors and a flexible coil former which may be separated along a axially extending circumferential line by suitable connectors at that point), see related commonly-assigned U.S. Pat. No. 4,897,604-Carlson et al, entitled "Method and Apparatus For Selective Adjustment of RF Coil Size For Magnetic Resonance Imaging" (the entire content of which is hereby incorporated by reference).

While only a few exemplary embodiments have been described in detail, those skilled in the art will realize that many variations and modifications may be made in these exemplary embodiments while yet maintaining many of the novel features and advantages of this invention. Accordingly, all such variations and modifications are intended to be included within the scope of the appended claims.

What is claimed is:

1. An interventional MRI system comprising:
   a transverse magnet MRI apparatus;
   an interventional appliance having predetermined maximum dimensions and adapted for physical interaction with a portion of a human anatomy to achieve interventional procedures therewithin during MRI within said transverse magnet MRI apparatus; and
   a solenoidal MRI RF coil located within said transverse magnet MRI apparatus and having a diameter less than the maximum dimensions of said appliance further including means to accommodate said appliance when used on a human patient for coupling MRI RF fields to or from the human anatomy and thus facilitating said interventional procedures during MRI.

2. An interventional MRI system as in claim 1 wherein said RF coil comprises:
a plurality of conductive turns juxta-posed along an axial dimension with said appliance and the human anatomy being imaged such that MRI is achieved, at least in part, using a fringe RF field of said RF coil which fringe field is disposed beyond an outer boundary of said solenoidal coil.

3. An interventional MRI system as in claim 1 wherein said RF coil comprises:
a helical conductor of diameter D and axial length L having a plurality of turns and a non-uniform pitch along at least a portion of the axial length thereof disposed so as to accommodate said appliance therewithin.

4. An interventional MRI system as in claim 3 wherein said non-uniform pitch portion includes a gap of axial length G between two turns of the coil with remaining turns being uniformly separated by pitch distance P which is substantially less than G.

5. An interventional MRI system as in claim 4 wherein said two turns are conductively connected by an axially-extending conductor disposed approximately tangent to the circumference of said coil.

6. An interventional MRI system as in claim 4 wherein said two turns are conductively connected by a conductor which extends radially beyond the circumference of said coil and also in an axial direction to provide a cleared volume surrounding the coil diameter at said gap area.

7. An interventional MRI system as in claim 3 wherein said non-uniform pitch portion includes a first group of turns disposed at an angle $+\alpha°$ with respect to a perpendicular cross-section of the coil and a second group of turns disposed at an angle $-\beta°$ with respect to a perpendicular cross-section of the coil so as to provide an angular opening $\alpha'+\beta°$ between said groups of turns.

8. An interventional MRI system as in claim 7 wherein $\alpha$ and $\beta$ are approximately equal.

9. An interventional MRI system as in claim 3 wherein said non-uniform pitch portion includes axially-extending offset deformations in said conductor along a circumferential portion of a subset of said turns thereby providing opened access inside of said coil.

10. An interventional MRI system as in claim 1 wherein at least one half of said coil includes conductor turns having selectively disconnectable joints therein.

11. An MRI RF coil comprising:
a helical conductor of diameter D and axial length L having a plurality of turns and a non-uniform pitch between turns along at least a portion of the axial length thereof;
wherein said non-uniform pitch portion includes a gap of axial length G between two turns of the coil with remaining turns being uniformly separated by pitch distance P which is substantially less than G; and
wherein said two turns are conductively connected by a conductor which extends radially beyond the circumference of said coil and also in an axial direction to provide a cleared volume surrounding the coil diameter at said gap area.

12. An MRI RF coil comprising:
a helical conductor of diameter D and axial length L having a plurality of turns and a non-uniform pitch between turns along at least a portion of the axial length thereof; and
wherein said non-uniform pitch portion includes a first group of turns disposed at an angle $+\alpha°$ with respect to a perpendicular cross-section of the coil and a second group of turns disposed at an angle $-\beta°$ with respect to a perpendicular cross-section of the coil so as to provide an angular opening $\alpha°+\beta°$ between said groups of turns.

13. An MRI RF coil as in claim 12 wherein $\alpha$ and $\beta$ are approximately equal.

14. An MRI RF coil comprising:
a helical conductor of diameter D and axial length L having a plurality of turns and a non-uniform pitch between turns along at least a portion of the axial length thereof; and
wherein said non-uniform pitch portion includes axially-extending offset deformations in said conductor along a circumferential portion of a subset of said turns thereby providing opened access inside of said coil.

* * * * *